June 2, 1970 D. A. HILLIS 3,516,002

GAIN AND DRIFT COMPENSATED AMPLIFIER

Filed May 2, 1967

Donuil A. Hillis,
INVENTOR.
BY.

ATTORNEY.

United States Patent Office 3,516,002

Patented June 2, 1970

3,516,002

GAIN AND DRIFT COMPENSATED AMPLIFIER

Donuil A. Hillis, Palos Verdes Peninsula, Calif., assignor to Hughes Aircraft Company, Culver City, Calif., a corporation of Delaware Filed May 2, 1967, Ser. No. 637,865
Int. Cl. H03f *1/02, 1/36*
U.S. Cl. 300—51 5 Claims

ABSTRACT OF THE DISCLOSURE

A gain and drift compensated amplifier composed from several amplifiers wherein the output of a basic amplifier is negatively fed back through a sample and hold circuit for reamplification by the basic amplifier. The sample and hold circuit and the input to the basic amplifier from a source of voltage is alternately opened and closed with respect to the output of the entire circuit.

The present invention relates to an amplifier having a compensated gain and drift and, more particularly, to a composite amplifier including a negative feedback circuit comprising a sample and hold circuit.

It has been difficult to obtain a voltage amplification over a large bandwidth with small drift or voltage offset characteristics in well-known amplifier circuits. Thus, it has only been possible either to obtain an excellent drift stability with a poor frequency response or, conversely, excellent frequency response but poor drift or voltage offset stability. This problem arises primarily with high frequency amplification since higher frequencies require correspondingly high power amplifiers. At lower frequencies and, therefore, lower power requirements, stabilization of drift or voltage offset is easier to obtain. In view of these problems, prior art devices include a circuit comprising a high gain amplifier having a very low offset and drift. The circuit is stabilized by carefully rolling off the gain at high frequencies to ensure that the roll-off characteristics crosses the zero gain point with a slope of no greater than ten decibels per octave. Despite the care with which such a circuit may be constructed, the accuracy is only within the range of one percent, assuming a gain of one hundred.

The present invention overcomes these problems by problems by providing several simple circuits which form a single composite amplifier having an accuracy of 0.01%, assuming an internal gain of 100 and a loop gain of 1. Basically, the output of an amplifier having a specific gain is first fed back to the amplifier through a sample and hold circuit for reamplification of the signal. The output from the amplifier is then fed to a further amplifier for supply to a succeeding stage. Any offset in the sample and hold negative feedback circuit is reduced by the ratio of the gain of the amplifier having the specific gain. In addition, a second feedback is provided at the supply to the succeeding stage and the second feedback is connected to the input of the amplifier having the specific gain. By so constructing and arranging the composite amplifier, the apparent internal gain thereof is increased as the square of the gain of the first amplifier while the apparent offset is reduced by the gain of the first amplifier.

It is, therefore, an object of the present invention to provide a high-performance amplifier with compensated drift and gain.

Another object is the provision of an accurate and stable circuit having large margins of frequency stability with low offset.

A further object is to provide such an amplifier having an improved frequency response with respect to its gain.

Another object of the invention is the provision of a highly accurate composite amplifier.

Another object is the provision of a means to isolate an output signal from an input signal.

Other aims and objects, as well as a more complete understanding of the present invention will appear from the following explanation of an exemplary embodiment and the accompanying drawings thereof, in which.

Figure 1:
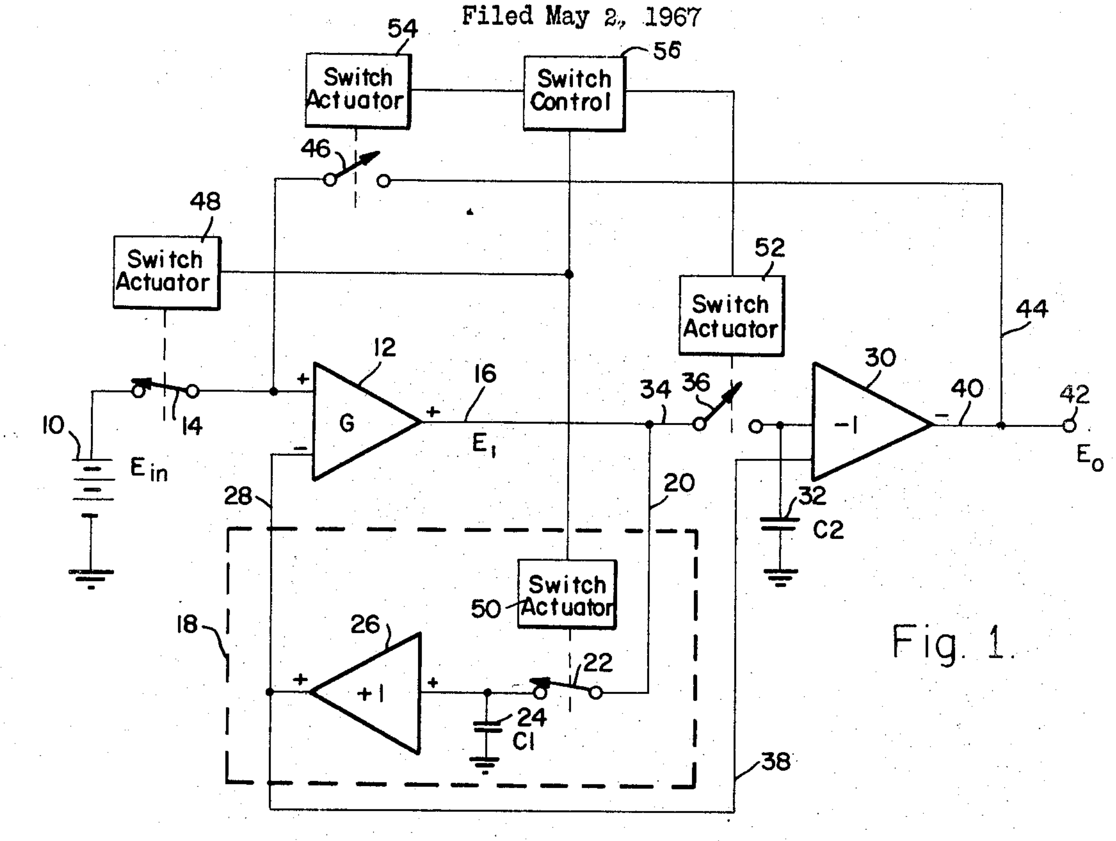
FIG. 1 is a schematic view of a first embodiment of the invention.

Accordingly, with refrence to FIG. 1, a voltage source 10 supplies a potential $E_{in}$ to an amplifier 12 through a switch 14. Amplifier 12 is so constructed and arranged as to impart a gain G to the difference between potential $E_{in}$ and the voltage in lead 28 which is equal to the amplified voltage $E_1$ at output lead 16. The amplified voltage is then fed through a lead 20 to a sample and hold circuit 18 which negatively feeds the signal back to amplifier 12 through a lead 28. The sample and hold circuit comprises a switch 22, a capacitor 24, and an amplifier 26. Amplifier 26 is secured to amplifier 12 by a lead 28 and acts as a buffer between capacitor 24 and amplifier 12.

The amplified voltage $E_1$ is also fed from lead 16 to an amplifier 30 and a capacitor 32 through a lead 34 and a switch 36. A lead 38 acts as reference line between sample and hold circuit 18 and amplifier 30. The output from amplifier 30 is conducted along a lead 40 to the output 42 of the invention at a potential of $E_0$. The output is further fed back to amplifier 12 through a lead 44 and a switch 46 to act as a degenerative feedback as compared to the potential on line 38.

Switches 14, 22, 36 and 46 are so arranged that, when switches 14 and 22 are closed, switches 36 and 46 are opened and, conversely, when switches 14 and 22 are open, switches 36 and 46 are closed. The switches are respectively operated by switch actuators 48, 50, 52 and 54. A switch control 56 is connected to all the switch actuators in such a manner as to provide the desired opening and closing of the switches. Although the switch actuators and switch control are depicted as mechanisms which operate on the switches, it is to be understood that the operation of the switches may be effected by any suitable means such as a keying or frequency sort, for example, multivibrators or switching transistors.

In operation, switches 14 and 22 are closed and switches 36 and 46 are opened. Potential $E_{in}$ is thereby supplied and amplified by amplifier 12 to provide an amplified voltage $E_1$. This voltage is supplied to and stored by capacitor 24 through lead 20. Capacitor 24 is thereby charged to approximately $E_1$, or more exactly $$E_{o1}=\frac{E_{in}G_{12}}{1+G_{12}}$$

Switches 14 and 22 are then opened and switches 36 and 46 are closed so that capacitor 24 passes the voltage therein through amplifier 26 for supply to amplifier 12 for reamplification and supply to amplifier 30 and capacitor 32. Because of the double amplification through amplifier 12, capacitor 32 is charged to a voltage which is approximately the voltage $E_{in}$ multiplied by the square of the apparent gain $$\left(\frac{G_{12}}{1+G_{12}}\right)$$

of the amplifier 12, or more exactly $$E_{c2}=\frac{E_{in}G_{12}^2}{(1+G_{12})^2}$$

At the same time, however, the effective gain of amplifier 30 is referenced to the initial charge of capacitor 24 by means of the connection to amplifier 30 through reference line 38. The output potential $E_0$ from amplifier 30 through lead 40, therefore, has been improved to approximately equal the output potential $E_1$ from amplifier 12 or almost exactly the input voltage $E_{in}$ since $$E=\frac{E_{in}(2G_{12}+G_{12}^2)}{(1+G_{12})^2}$$

Furthermore, the output potential $E_0$ is stabilized by means of the feedback through lead 44 and closed switch 46 to amplifier 12.

The gain G of amplifier 12 is relatively low, chosen to be approximately the square root of an equivalent amplifier used in prior art circuits. The offset in amplifier 36 is reduced by the gain factor of amplifier 12. The cancellation in offset of amplifier 12 is obtained by the feedback loop through lead 44 through switch 46 to the input of amplifier 12. The offset in amplifier 30 is also reduced by the ratio of the gain of amplifier 12 by means of the respective inputs to amplifier 30. Thus, the two feedback loops effected by leads 20 and 44 compensate for the offset of internal amplifiers 12, 26, and 30.

Figure 2:
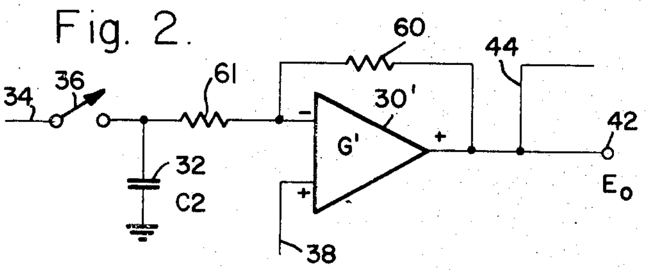
FIG. 2 is a schematic diagram of a variation of a portion of the circuit depicted in FIG. 1.

Referring now to FIG. 2, amplifier 30 of FIG. 1 is functionally equivalent to an amplifier 30' having a gain G'. In this embodiment, the output from amplifier 12 when switches 36 and 46 are closed and switches 14 and 22 are open, is supplied as one input to amplifier 30'. Lead 38 comprises another input to amplifier 30'. A resistor 60 is connected to provide a negative feedback loop for amplifier 30'. The output from amplifier 30' thus comprises the input signal from lead 38 less the difference between leads 34 and 38 as amplified by the ratio of the value of resistor 60 and resistor 61, i.e. $R60/R61$.

Figure 3:
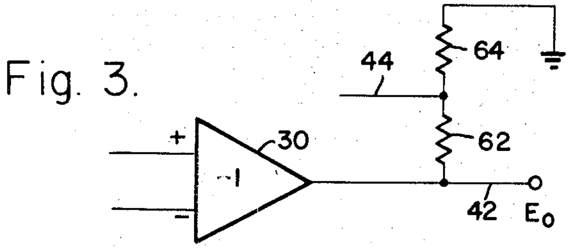
FIG. 3 is a schematic diagram of a portion of the circuit shown in FIG. 1 wherein the input voltage has been amplified.

The composite amplifier depicted in FIG. 1 provides for an amplification factor of one. If desired, however, the input voltage from source 10 may be amplified by means of the variation depicted in FIG. 3 wherein the output from amplifier 30 is fed back through a voltage divider comprising resistors 62 and 64. The feedback through lead 44 is taken from a point between the two resistors in such a manner that its value depends upon the particular values of resistors 62 and 64.

Although the invention has been described with reference to particular embodiments thereof, it should be realized that various changes and modifications may be made therein without departing from the spirit and scope of the invention.

What is claimed is:

1. A gain and drift compensated amplifier having an input coupled to a source of voltage and an output comprising:

a first amplifier having output means and first and second input means, said first input means coupled to the source input, a sample and hold negative feedback circuit coupled to and between said second input means and said output means of said first amplifier, a differential amplifier having an output terminal and first and second input terminals, said first input terminal being coupled to said output means of said first amplifier, said second input terminal being coupled to said second input means and said output terminal coupled to said first input means, switching means coupled between said first input means and the source input, between said output means and said negative feedback circuit and in said negative feedback circuit, between said output terminal and said first input means, and at said first input terminal, and control means connected to said switching means for selective opening and closing thereof.

2. An amplifier as in claim 1 wherein said differential amplifier has a gain of −1.

3. An amplifier as in claim 1 wherein said sample and hold negative feedback circuit an amplifier and a grounded holding capacitor coupled to the input thereof.

4. An amplifier as in claim 3 wherein said third amplifier comprises a potentiometric amplifier.

5. An amplifier as in claim 1 including voltage amplifying means coupled to said differential amplifier.

References Cited

UNITED STATES PATENTS

| | | | |
|---|---|---|---|
| 3,237,116 | 2/1966 | Skinner et al. | 330—9 |
| 3,277,355 | 10/1966 | Troutman et al. | 318—28 |

NATHAN KAUFMAN, Primary Examiner

U.S. Cl. X.R.

330—9, 85

PO-1050
(5/69)

UNITED STATES PATENT OFFICE
CERTIFICATE OF CORRECTION

Patent No. 3,516,002 Dated June 2, 1970

Inventor(s) Donuil A. Hillis

It is certified that error appears in the above-identified patent and that said Letters Patent are hereby corrected as shown below:

Col. 1, lines 45 & 46, after "problems" delete "by problems"

Col. 3, line 18, that portion of the equation reading

"E = ," should read: --$E_o$ = --

Col. 4, line 35, after "circuit" add: --includes--

Signed and sealed this 6th day of April 1971.

(SEAL)
Attest:

EDWARD M.FLETCHER,JR.
Attesting Officer

WILLIAM E. SCHUYLER, JR.
Commissioner of Patents